(12) United States Patent
Kaneko

(10) Patent No.: US 8,055,965 B2
(45) Date of Patent: *Nov. 8, 2011

(54) SEMICONDUCTOR INTEGRATED CIRCUIT AND METHOD OF TESTING THE SAME

(75) Inventor: Naoki Kaneko, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/801,182

(22) Filed: May 26, 2010

(65) Prior Publication Data

US 2010/0306607 A1  Dec. 2, 2010

(30) Foreign Application Priority Data

May 28, 2009  (JP) .................................. 2009-129489

(51) Int. Cl.
*G01R 31/28* (2006.01)
(52) U.S. Cl. .................... 714/729; 714/726; 714/731
(58) Field of Classification Search .................. 714/726, 714/729, 731
See application file for complete search history.

(56) References Cited

U.S. PATENT DOCUMENTS

| | | | | |
|---|---|---|---|---|
| 5,900,753 A * | 5/1999 | Cote et al. | ...................... | 327/145 |
| 6,275,081 B1 * | 8/2001 | Flake | ............... | 327/202 |
| 6,442,722 B1 * | 8/2002 | Nadeau-Dostie et al. | ..... | 714/731 |
| 7,058,868 B2 * | 6/2006 | Guettaf | ......................... | 714/727 |
| 7,089,471 B2 * | 8/2006 | Guettaf | ......................... | 714/731 |
| 7,134,061 B2 * | 11/2006 | Agashe et al. | ................. | 714/726 |
| 7,290,191 B2 * | 10/2007 | Grise et al. | ...................... | 714/726 |
| 7,383,481 B2 * | 6/2008 | Warren et al. | ................. | 714/726 |
| 7,456,674 B2 * | 11/2008 | Oakland | ....................... | 327/291 |
| 7,698,613 B2 | 4/2010 | Kudo | | |
| 2003/0154434 A1 * | 8/2003 | Hou | ................................ | 714/734 |
| 2007/0200597 A1 * | 8/2007 | Oakland | .......................... | 326/46 |
| 2007/0226565 A1 | 9/2007 | Kudo | | |
| 2008/0115005 A1 * | 5/2008 | Kamada | ......................... | 713/501 |
| 2009/0240997 A1 * | 9/2009 | Hasegawa | ...................... | 714/731 |

FOREIGN PATENT DOCUMENTS

JP  2007-248135 A  9/2007

\* cited by examiner

*Primary Examiner* — John J Tabone, Jr.
(74) *Attorney, Agent, or Firm* — McGinn Intellectual Property Law Group, PLLC

(57) ABSTRACT

A semiconductor integrated circuit includes: a plurality of scan flip-flops configured to form a scan chain in a scan test; and a plurality of clock gating circuits connected between a clock input and corresponding portions of the plurality of scan flip-flops, respectively. The plurality of clock gating circuits are connected in serial to form a chain and gating setting data is inputted in serial through the chain connection. Each of the plurality of clock gating circuits controls a connection between the clock input and a corresponding portion of the plurality of scan flip-flops based on the gating setting data.

7 Claims, 6 Drawing Sheets

SEMICONDUCTOR INTEGRATED CIRCUIT AND METHOD OF TESTING THE SAME

INCORPORATION BY REFERENCE

This patent application claims a priority on convention based on Japanese Patent Application No. 2009-129489 filed on May 28, 2009. The disclosure thereof is incorporated herein by reference.

TECHNICAL FIELD

The present invention relates to a semiconductor integrated circuit and a method of testing the semiconductor integrated circuit, and more particularly, to a scan circuit and a scan test method.

BACKGROUND ART

A design technique is known in which a test circuit is previously incorporated in a semiconductor integrated circuit in a design stage in order to check whether a delay fault or a stuck-at fault occurs after or during production of the semiconductor integrated circuit. For example, a scan test of a scan chain is performed by the previously incorporated scan circuit. In the scan test, a test pattern data is inputted to a combinational circuit by a shift operation of the scan chain and an output data of the combinational circuit is taken out to a scan cell (flip-flop) by a capture operation. Next, the output data taken out to the scan cell is outputted to outside by the shift operation. Whether a logic circuit in a circuit to be tested is in a good state or a fault state can be determined by comparing the data taken out in this manner (scan out data) with an expected value.

In the semiconductor integrated circuit, when an operation current exceeding a power supply capacity flows, a power supply cannot maintain a power supply voltage necessary for the semiconductor integrated circuit to properly operate, thereby causing a malfunction. Especially, with upsizing and speeding-up of the semiconductor integrated circuit, a power consumption amount has prominently increased in execution of the scan test. For this reason, the test circuit is demanded in which the increase in the power consumption amount can be suppressed in the execution of the scan test.

A technique related to a scan circuit is described in patent literature 1. FIG. 1 is a diagram showing a configuration of the scan circuit described in the patent literature 1. FIG. 2 shows timing charts in a scan test operation described in the patent literature 1.

Referring to FIGS. 1 and 2, during a scan shift operation period (SCAN_Shift), a final value of a scan shift operation is inputted to scan flip-flops built in test clock control circuits TC11, TC12, and TC13. For example, "0" is inputted to the test clock control circuit TC11, "1" is inputted to the test clock control circuit TC12 and "0" is inputted to the test clock control circuit TC13. By setting a scan enable signal SEN to a low level in this state, the mode is switched to a scan capture mode.

During a scan capture period (SCAN_Capture), clock output signals MCOUT1 and MCOUT3 of the test clock control circuits TC11 and TC13 are fixed to "0" corresponding to the value "0" inputted in the shift operation, so as not to operate as a clock pulse. As a result, the capture operation to a register group SFFG1a to SFFG1z and a register group SFFG3a to SFFG3z is not performed and data is not taken out from scan output terminals SOT2 and SOT4.

Meanwhile, during the scan capture period, a clock output signal MCOUT2 of the test clock control circuit TC12 functions as the same clock pulse as a test clock SCLK based on the value "1" inputted in the shift operation. As a result, data shift-inputted to a register group SFFG2a to SFFG2z by the shift operation is taken out from a scan output terminal SOT3.

As described above, in the scan circuit described in the patent literature 1, by controlling to supply a clock to only a desired clock domain, it is possible to stop supply of the clock to only a particular clock domain, thereby suppressing a power consumption amount during execution of the scan test.

CITATION LIST

[Patent literature 1]: JP2007-248135A

SUMMARY OF THE INVENTION

Stopping supply of clock to an arbitrary clock domain or a scan chain in a scan test has an effect of suppressing a power consumption amount in the test. However, in the patent literature 1, in the shift operation in the scan test, the clock domain to which the clock should be supplied is set. In this case, during a scan shift period, the clock is supplied to all of the scan flip-flops in the scan chain, and all of the scan flip-flops perform the shift operation. Thus, there is a demand for a scan circuit and a scan test method which can reduce a power consumption amount in the capture period as well as the shift operation.

In an aspect of the present invention, a semiconductor integrated circuit includes: a plurality of scan flip-flops configured to form a scan chain in a scan test; and a plurality of clock gating circuits connected between a clock input and corresponding portions of the plurality of scan flip-flops, respectively. The plurality of clock gating circuits are connected in serial to form a chain and gating setting data is inputted in serial through the chain connection. Each of the plurality of clock gating circuits controls a connection between the clock input and a corresponding portion of the plurality of scan flip-flops based on the gating setting data.

In another aspect of the present invention, a test method of a semiconductor integrated circuit, is achieved by setting connection or disconnection of a clock input for each of portions of a plurality of scan flip-flops of a scan chain; and by inputting a test pattern data to the scan chain to which the connection or the disconnection is set.

According to the present invention, a power consumption amount in a scan test can be reduced. Moreover, false determination in the scan test can be reduced.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Figure 1:
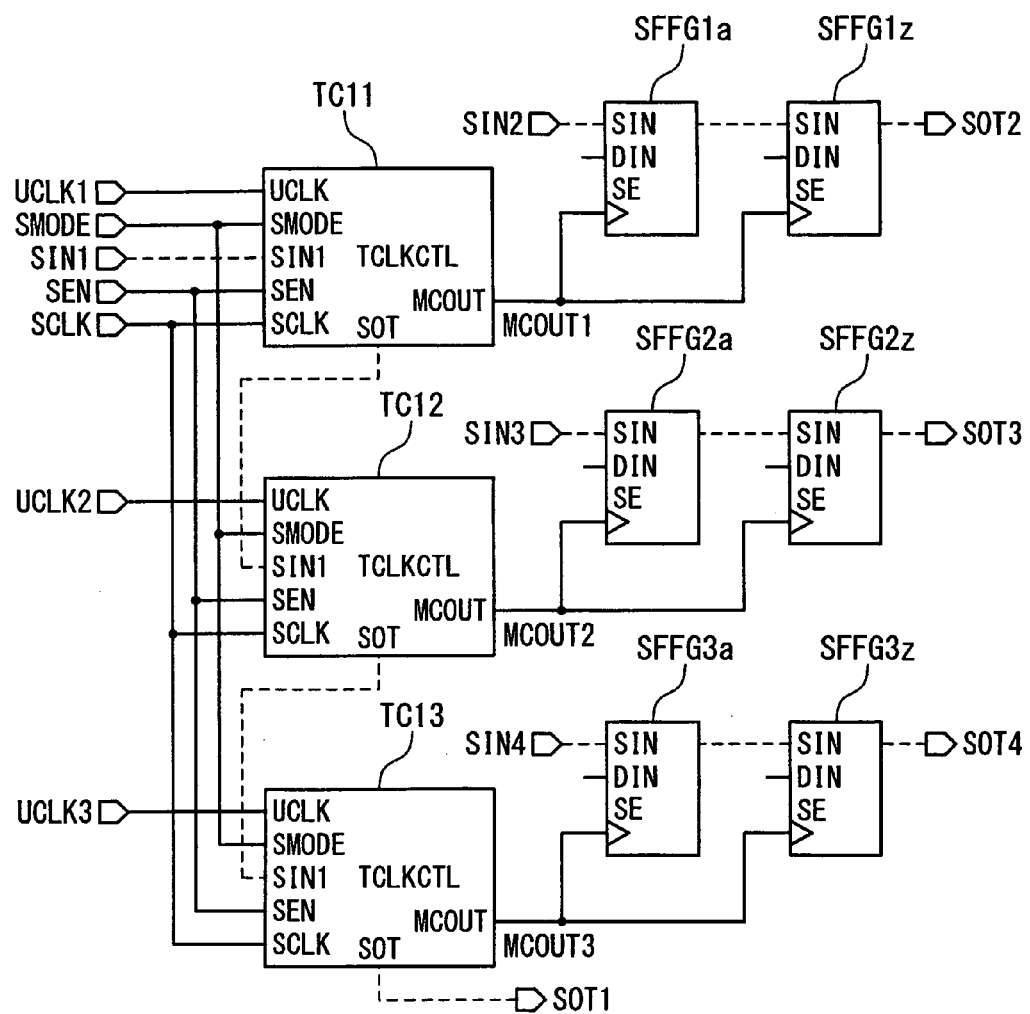
FIG. 1 is a diagram showing a configuration of a scan circuit according to a conventional technique.
Figure 2:
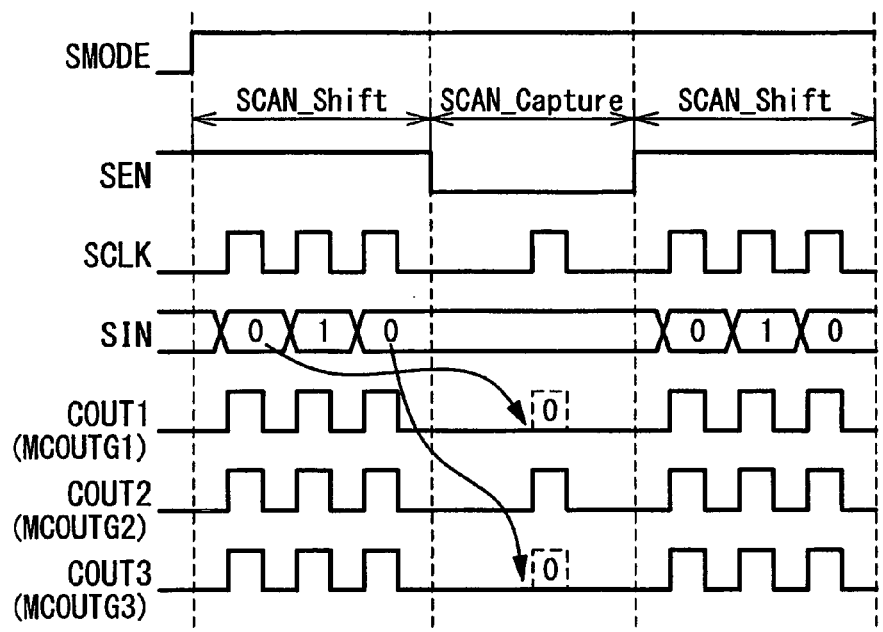
FIG. 2 shows timing charts in a scan test operation according to the conventional technique.

Hereinafter, a semiconductor integrated circuit of the present invention will be described with reference to the attached drawings. In the drawings, same or similar reference numerals designate same or similar components.

Figure 3:
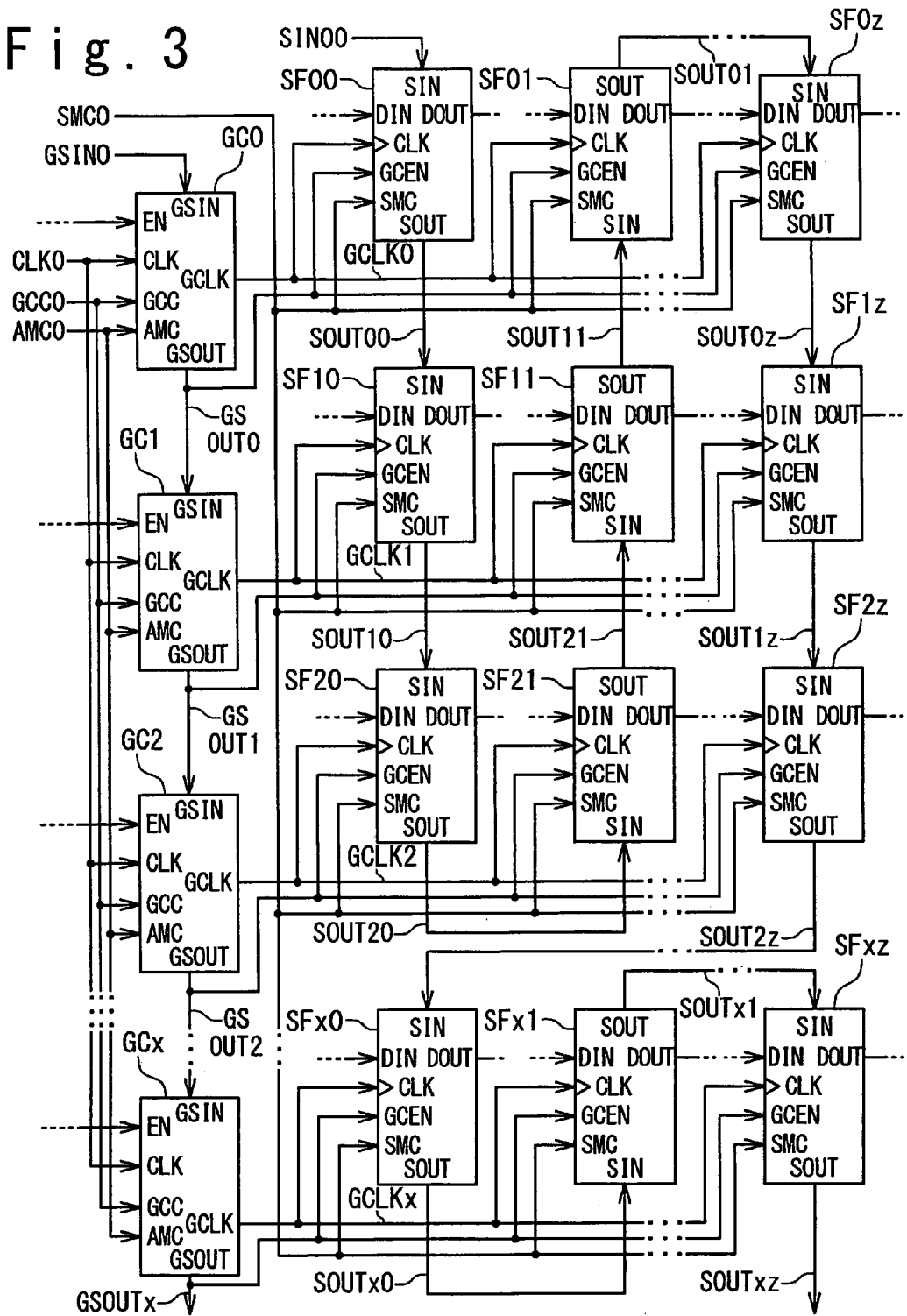
FIG. 3 is a diagram showing a configuration of a scan circuit according to the present invention.
Figure 4:
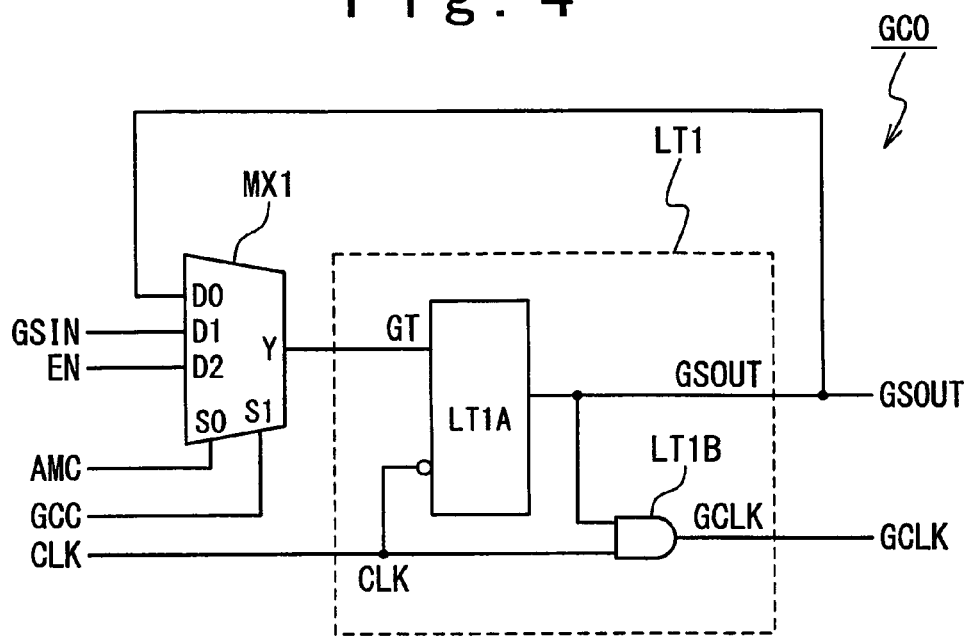
FIG. 4 is a diagram showing a configuration of a clock gating circuit according to the present invention.
Figure 5:
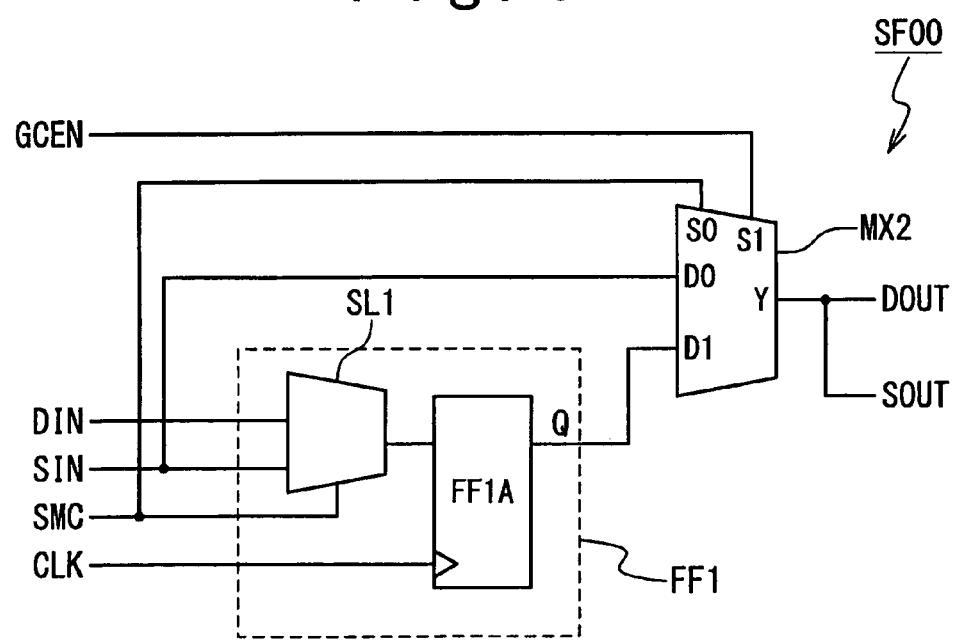
FIG. 5 is a diagram showing a configuration of a scan flip-flop according to the present invention.

Referring to FIGS. 3 to 5, a configuration of the semiconductor integrated circuit (scan circuit) according to the present invention will be described. FIG. 3 is a diagram showing a configuration of a scan circuit in the semiconductor integrated circuit according to the present invention. Referring to FIG. 3, the scan circuit of the present invention includes a plurality of clock gating circuits GC0 to GCx and a plurality of scan flip-flops SF00 to SF0z, SF10 to SF1z, SF20 to SF2z, . . . , and SFxO to SFxz. It is noted that x, z each are an integer.

The scan circuit according to the present invention has a clock input CLK0, a scan input SIN00, a scan output SOUTxz, a gating control input GSIN0, clock gating enable output GSOUTx, a test mode control signal input AMC0, a scan mode control signal input SMC0 and a clock gating circuit setting control input GCC0 as terminals. Hereinafter, the clock gating enable output GSOUTx is referred to as an enable output GSOUTx, the test mode control signal input AMC0 is referred to as a mode control input AMC0, the scan mode control signal input SMC0 is referred to as a mode control input SMC0 and the clock gating circuit setting control input GCC0 is referred to as a setting control input GCC0.

Each of the clock gating circuits GC0 to GCx includes a normal operation clock gating enable signal input EN, a scan clock gating enable signal input GSIN, a test mode control signal input AMC, a clock gating circuit setting control input GCC, a gated clock output GCLK, a clock gating enable output GSOUT and a clock input CLK as terminals. Hereinafter, the normal operation clock gating enable signal input EN is referred to as an enable signal input EN, the scan clock gating enable signal input GSIN is referred to as an enable signal input GSIN, the test mode control signal input AMC is referred to as a control signal input AMC, the clock gating circuit setting control input GCC is referred to as a setting control input GCC and the clock gating enable output GSOUT is referred to as an enable output GSOUT.

Each of the scan flip-flops SF00 to SF0z, SF10 to SF1z, SF20 to SF2z, . . . , and SFx0 to SFxz includes terminals for a data input DIN, a scan input SIN, a scan clock gating enable signal input GCEN, a scan mode control input SMC, a clock input CLK, a data output DOUT and a scan output SOUT. Hereinafter, the scan clock gating enable signal input GCEN is referred to as an enable signal input GCEN and the scan mode control input SMC is referred to as a mode control input SMC.

The clock input CLK0 is connected to the clock inputs CLK of all the clock gating circuits GC0 to GCx. The setting control input GCC0 is connected to the setting control inputs GCC of all the clock gating circuits GC0 to GCx. The mode control input AMC0 is connected to the mode control inputs AMC of all the clock gating circuits GC0 to GCx.

The gating control input GSIN0 is connected to the enable signal input GSIN of the clock gating circuit GC0. The enable output GSOUT (GSOUT0) of the clock gating circuit GC0 is connected to the enable signal input GSIN of the clock gating circuit GC1, and the enable output GSOUT (GSOUT1) of the clock gating circuit GC1 is connected to the enable signal input GSIN of the clock gating circuit GC2. Similarly, the enable outputs GSOUT are sequentially chain-connected in series up to the clock gating circuit GCx.

The enable output GSOUT (GSOUT0) of the clock gating circuit GC0 is connected to the enable signal inputs GCEN of the scan flip-flops SF00 to SF0z. The enable output GSOUT (GSOUT1) of the clock gating circuit GC1 is connected to the enable signal inputs GCEN of the scan flip-flops SF10 to SF1z. The enable output GSOUT (GSOUT2) of the clock gating circuit GC2 is connected to the enable signal inputs GCEN of the scan flip-flops SF20 to SF2z. Similarly, the enable output GSOUT (GSOUTx) of the clock gating circuit GCx is connected to the enable signal inputs GCEN of the scan flip-flop SFx0 to SFxz.

The gated clock output GCLK (GCLK0) of the clock gating circuit GC0 is connected to the clock inputs CLK of the scan flip-flops SF00 to SF0z. The gated clock output GCLK (GCLK1) of the clock gating circuit GC1 is connected to the clock inputs CLK of the scan flip-flops SF10 to F1z. The gated clock output GCLK (GCLK2) of the clock gating circuit GC2 is connected to the clock inputs CLK of the scan flip-flops SF20 to F2z. Similarly, the gated clock output GCLK (GCLKx) of the clock gating circuit GCx is connected to the clock inputs CLK of the scan flip-flops SFx0 to Fxz.

The scan input SING00 is connected to the scan input SIN of the scan flip-flop SF00, the scan output SOUT (SOUT00) of the scan flip-flop SF00 is connected to the scan input SIN of the scan flip-flop SF10, and the scan output SOUT (SOUT10) of the scan flip-flop SF10 is connected to the scan input SIN of the scan flip-flop SF20. Similarly, the scan flip-flops are chain-connected through the scan output SOUT and the scan input SIN to constitute a scan chain having the scan flip-flop SF00 as an input stage (initial stage) and the scan flip-flop SFxz as a final stage.

The scan mode control signal input SMC0 is connected to the mode control inputs SMC of all the scan flip-flops SF00 to SFxz.

Next, referring to FIG. 4, a configuration of the clock gating circuits GC0 to GCx according to the present invention will be described in detail. FIG. 4 is a diagram showing the configuration of the clock gating circuit GC0 according to the embodiment of the present invention. Since the configurations of the other clock gating circuits GC1 to GCxz is the same as that of the clock gating circuit GC0, description thereof is omitted.

The clock gating circuit GC0 includes a multiplexer MX1 and a clock gating cell LT1. The multiplexer MX1 includes data inputs D0 to D2 and control signal inputs S0 and S1 as input terminals and an output Y as an output terminal. The data input D0 is connected to the enable output GSOUT, the data input D1 is connected to the enable signal input GSIN and the data input D2 is connected to the enable signal input EN. The control signal input S0 is connected to the mode control input AMC and the control signal input S1 is connected to the setting control input GCC. The output Y is connected to a control input GT of the clock gating cell LT1.

The multiplexer MX1 selects one of the data inputs D0 to D2 based on the signal levels (logic values) of the mode control input AMC and the setting control input GCC inputted to the control signal inputs S0 and S1, and outputs the selected data input from the output Y to the clock gating cell LT1. In detail, the clock gating circuit GC0 is set to a test mode in response to the mode control input AMC in a high level. In the test mode, the data input D1 (enable signal input GSIN) is outputted from the output Y in response to the setting control input GCC in the high level and the data input D0 (enable output GSOUT) is outputted in response to the setting control input GCC in a low level. On the other hand, the clock gating circuit GC0 is set to a normal mode in response to the mode control input AMC in the low level. In the normal mode, the data input D2 (enable signal input EN) is outputted from the output Y at all time.

The clock gating cell LT1 controls connection (supply) and disconnection (supply stop) of the clock to the scan flip-flop in response to the enable signal (output Y) selected by the multiplexer MX1. The clock gating cell LT1 includes the control signal input GT and the clock input CLK as input terminals, and the enable output GSOUT and the gated clock output GCLK as output terminals. The clock gating cell LT1 includes a latch circuit LT1A and an AND circuit LT1B. The latch circuit LT1A latches the enable signal supplied to the control signal input GT in response to the clock input CLK and outputs the latched enable signal to the enable output GSOUT. The AND circuit LT1B outputs a logical product of the clock input CLK and the enable output GSOUT to the gated clock output GCLK. The AND circuit LT1B may be realized by another logic operation.

In the test mode, the data input D1 (enable signal input GSIN) is supplied to the clock gating cell LT1 in response to the setting control input GCC in the high level. At this time, the gated clock output GCLK indicates a signal level corresponding to the enable signal input GSIN. Here, when the setting control input GCC is in the low level, the enable output GSOUT is fixed to the signal level of the data latched by the clock gating cell LT1. That is, data (enable output GSOUT) for determining connection or disconnection of the gated clock output GCLK is set to the clock gating circuit GC0. For example, when the clock gating circuit GC0 is set (fixed) to the enable output GSOUT in the high level, the gated clock output GCLK has a signal level corresponding to the clock input CLK. In other words, the gated clock output GCLK is in a connection state and a clock signal from the clock input CLK is supplied to the scan flip-flops SF00 to SF0z (clock connection). Alternatively, when the clock gating circuit GC0 is set (fixed) to the enable output GSOUT in the low level, the gated clock output GCLK is fixed to the low level (clock disconnection).

On the other hand, in the normal mode, the data input D2 (enable signal input EN) is supplied to the clock gating cell LT1. At this time, the gated clock output GCLK indicates the signal level corresponding to the enable signal input EN. That is, the data (enable output GSOUT) for determining connection or disconnection of the gated clock output GCLK is set to the clock gating circuit GC0. For example, when the clock gating circuit GC0 is set (fixed) to the enable output GSOUT in the high level, the gated clock output GCLK having the signal level corresponding to the clock input CLK is outputted (clock conduction). Alternatively, when the clock gating circuit GC0 is set (fixed) to the enable output GSOUT in the low level, the gated clock output GCLK is fixed to the low level (clock blocking).

FIG. 5 is a diagram showing a configuration of the scan flip-flop SF00 used in the scan circuit according to the present invention. Since the configuration of the other scan flip-flops SF01 to SFxz is the same as that of the scan flip-flop SF00, description thereof is omitted. Referring to FIG. 3, the scan flip-flop SF00 includes a flip-flop FF1 and a multiplexer MX2. The scan flip-flop SF00 includes the data input DIN, the scan input SIN, the enable signal input GCEN, the mode control input SMC and the clock input CLK as input terminals, and the data output DOUT and the scan output SOUT as output terminals.

The flip-flop FF1 includes a selector SL1 which is connected to each of the data input DIN, the scan input SIN and the mode control input SMC, and a flip-flop FF1A which is connected to an output of the selector and the clock input CLK and has an output Q. The output Q of the flip-flop FF1A is connected to the data input D1 of the multiplexer MX2. The selector SL1 selects either the data input DIN or the scan input SIN in response to the signal level of the mode control input SMC and outputs the selected input to the flip-flop FF1A. The flip-flop FF1A latches the output of the selector SL1 in response to the clock CLK and outputs the output from the output Q to the multiplexer MX2.

The multiplexer MX2 selects one of the data inputs D0 and D1 in response to the signal levels of the mode control input SMC and the enable signal input GCEN supplied to the control signal inputs S0 and S1, and outputs the selected input to the data output DOUT and the scan output SOUT. In detail, the scan flip-flop FS00 is set to a scan shift mode in response to the mode control input SMC in the high level, and the flip-flop FF1A latches the scan input SIN in response to the clock input CLK. Here, the multiplexer MX2 selects the data input D1 (output Q) and sets it as the output Y when the enable signal input GCEN is in the high level (scan shift), and selects the data input D0 (scan input SIN) and sets it as the output Y when the enable signal input GCEN is in the low level (through output). On the other hand, the scan flip-flop FS00 is set to a capture mode or the normal mode in response to the mode control input SMC in the low level and the flip-flop FF1A latches the data input DIN in response to the clock input CLK. Here, the multiplexer MX2 selects the data input D1 (output Q) and sets it as the output Y irrespective of the signal level of the enable signal input GCEN.

Next, referring to FIGS. 6 and 7, an example of a scan test operation according to the present invention will be described. According to the present invention, prior to the scan test, whether the clock is connected or disconnected is set to each of the clock gating circuits GC0 to GCx. A mode of performing this setting operation is referred to as a clock gating setting mode.

Figure 6:
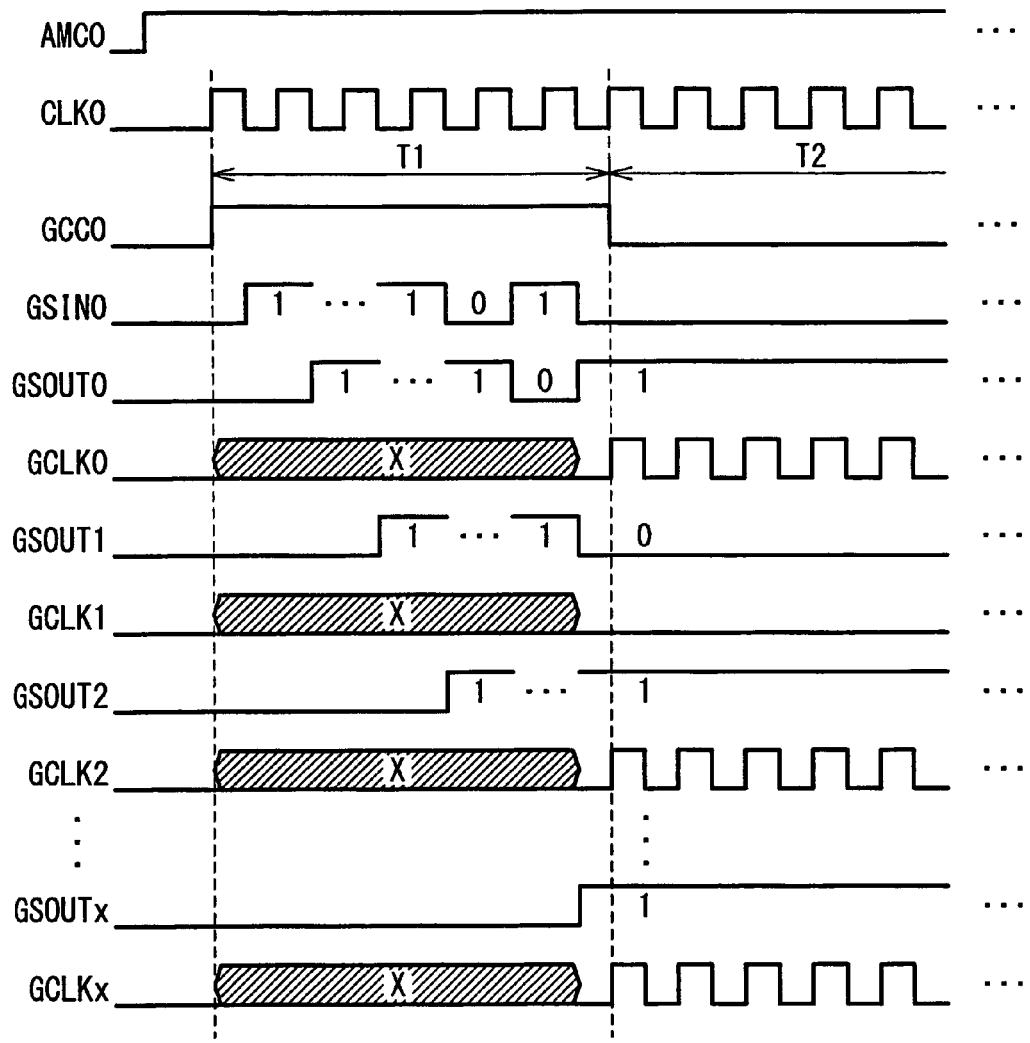
FIG. 6 shows timing charts in a clock gating setting operation according to the present invention.

FIG. 6 is a timing chart showing an example of a clock gating setting operation according to the present invention. Referring to FIG. 6, first, the scan circuit shown in FIG. 3 is switched to the test mode in response to the mode control input AMC0 in the high level. In this state, in a period T1 during which the setting control input GCC0 is in the high level, the scan circuit is set to the clock gating setting mode.

In the period T1, data (gating setting data) for setting a desired state (clock connection or disconnection) is serially supplied from the gating control input GSIN0 to the clock gating circuits GC0 to GCx in synchronization with the clock input CLK0. The gating setting data serially supplied from the gating control input GSIN0 is supplied sequentially to the clock gating circuits GC0 to GCx through the enable signal input GSIN and the enable output GSOUT. At this time, the gating setting data in the high level is supplied to the clock gating circuit to be set to the connection state, and the gating setting data in the low level is supplied to the clock gating circuit to be set to the disconnection state. In the period T1, values of the gated clock outputs GCLK0 to GCLKx are not determined and values (x) corresponding to respective enable outputs GSOUT are shown.

At the time when the desired gating setting data is supplied to all the clock gating circuits GC0 to GCx, the setting control input GCC0 is set to the low level, so that the clock gating setting mode is terminated (period T2). At this time, the clock gating circuits GC0 to GCx hold the gating setting data supplied to the gating control input GSIN in response to the setting control input GCC0 in the low level. Thereby, clock connection or clock disconnection is set together with the value of the enable output GSOUT of each of the clock gating circuits GC0 to GCx, and as the result of this, the scan test can be started.

In an example shown in FIG. 6, by the above-mentioned clock gating setting operation, the gating setting data in the high level is set to the clock gating circuits GC0 and GC2 and the gating setting data in the low level is set to the clock gating circuit GC1. In this case, the enable outputs GSOUT0 and GSOUT2 of the clock gating circuits GC0 and GC2 are in the high level and the gated clock output has the signal level corresponding to the clock input CLK. In other words, the clock gating circuits GC0 and GC2 are set to clock connection. On the other hand, the enable output GSOUT1 of the clock gating circuit GC1 is in the low level and the gated clock output is fixed to the low level. In other words, the clock gating circuit GC1 is set to clock disconnection. In a similar manner, the clock connection or the clock disconnection is set to the other clock gating circuits.

As described above, according to the present invention, prior to the scan test, the clock connection or the clock disconnection can be set to each of the clock gating circuits GC.

Figure 7:
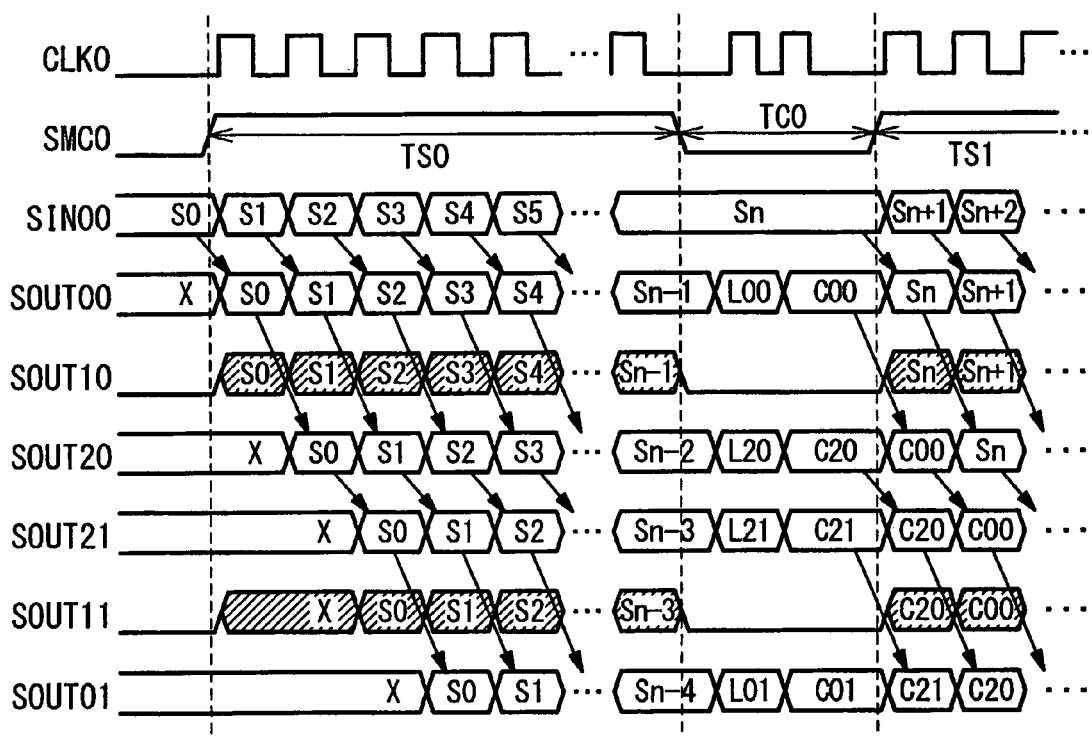
FIG. 7 shows timing charts in a scan test operation according to the present invention.

FIG. 7 is a timing chart showing an example of the scan test operation according to the present invention. Referring to FIG. 7, the scan shift operation (periods TS0 and TS1) and the capture operation (period TC0) in the scan test operation according to the present invention will be described in detail. Here, in the clock gating circuit setting mode, the "clock connection" or the "clock disconnection" is previously set to all the clock gating circuits GC0 to GCx shown in FIG. 3. In the present example, the clock gating circuit GC1 is set to the "clock disconnection" and the other clock gating circuits are set to the "clock connection".

In performing the scan test, the mode control inputs AMC of the clock gating circuits GC0 to GCx are set to the high level and the setting control inputs GCC are set to the low level. Thereby, while the scan test is performed (TS0, TC0, TS1), the clock gating circuit GC0 to GCx output the enable output GSOUT (GSOUT0 to GSOUTx) and the gated clock output GCLK (GCLK0 to GCLKx) based on the clock gating setting. In this example, the enable outputs GSOUT0, GSOUT2 to GSOUTx of the clock gating circuits GC0, GC2 to GCx are set to the high level and the gated clock outputs GCLK0, GCLK2 to GCLKx become the clock signals having a period corresponding to the clock input CLK. The enable output GSOUT1 of the clock gating circuit GC1 is set to the low level and the output of the gated clock output GCLK1 is disconnected.

As described above, the gated clock output GCLK1 is disconnected and stopped during the scan test. In this case, the scan flip-flops SF10 to SF1z in which the clock input CLK is connected to the clock gating circuit GC1 do not perform operation in response to the clock input CLK during the scan test.

In the scan test, inputting of the test pattern data by scan shift (scan shift mode (scan-in): period TS0), writing of data by the capture operation (capture mode: period TC0) and reading of capture data to outside by scan shift (scan shift mode (scan-out): period TS1) are performed.

First, the operation in the scan shift mode (scan-in: period TS0) will be described. In the scan shift mode (period TS0), a group of scan flip-flops constitutes the scan chain (shift register) in response to the mode control input SMC in the high level. During this period, the test pattern data S0 to Sn are supplied to the scan flip-flops by the shift operation of the scan chain.

On the other hand, in the scan shift mode, the scan flip-flops SF10 to SF1z output the scan input SIN as it is in response to the enable signal input GCEN in the low level. Since the clock input CLK is stopped, the scan flip-flops SF10 to SF1z do not latch the scan input SIN. For example, in the period TS0, the scan output SOUT of the scan flip-flop SF10 outputs the scan input SIN as it is. Accordingly, the scan flip-flop SF20 operates so as to input a value from the scan output SOUT00 preceding the scan output SOUT10 in a previous stage. Similarly, since the scan output SOUT of the scan flip-flop SF11 outputs the scan input SIN as it is, the scan flip-flop SF01 operates so as to input a value from the scan output SOUT21 preceding the scan output SOUT11 in a previous stage.

Next, when test data is supplied to the whole scan chain, the mode control input SMC shifts to the low level and the mode shifts to the capture mode (period TC0). The scan flip-flops SF00 to SF0z, and SF20 to SFxz latch the data input DiN in response to the clock input CLK and output the latched data (capture data) to the data output DOUT and the scan output SOUT. In an example shown in FIG. 7, in a period TC0, two clock pulses are supplied to the clock input CLK. In response to a first clock pulse, the scan flip-flops start the capture operation. In response to a second clock pulse, data to be verified is read from the scan flip-flops. For example, in the period TC0, the scan flip-flops SF00, SF20, SF21, and SF01 output data L00, L20, L21, L01 in the period TCO in response to the first clock input CLK, respectively. For example, the scan flip-flop SF00, SF20, SF21, SF01 output the capture data C00, C20, C21, C01 corresponding to the test data Sn and the data L00, L20, L21 in response to a next clock input, respectively.

Also, in the capture mode, since the gated clock output GCLK1 is in the disconnection state, the clock signal is not supplied to the scan flip-flops SF10 to SF1z. For this reason, in the capture operation period TC0, the scan outputs SOUT of the scan flip-flops SF10 to SF1z are fixed to the low level as an initial value of the flip-flop FF1.

When data is captured by the scan flip-flops, the mode control input SMC shifts to the high level and the mode shifts to the scan shift mode (scan-out) (period TS1). In the period TS1, the capture data shifts the scan chain and is outputted from the scan output SOUTxz of the scan flip-flop SFxz in a final stage. During this period, as in the scan-in, the scan flip-flops SF10 to SF1z output the scan input SIN as it is in response to the enable signal input GCEN in the low level.

According to the present invention, in the clock gating setting mode prior to the scan test, the clock connection or the clock disconnection is set to the clock gating circuits GC0 to GCx. For this reason, in the scan shift operation period, the clock connection/disconnection state of the clock gating circuits GC0 to GCx does not change, and an arbitrary clock gating circuit is disconnected during the scan test. The individual scan flip-flops output the scan input as it is to the scan output when the supply of the clock is stopped in the scan shift operation. Accordingly, even if the arbitrary clock gating circuit is disconnected in the scan shift operation, the scan shift operation can be achieved without any problem. Therefore, in the scan capture operation as well as the scan shift operation, clock disconnection can be performed based on control of the arbitrary clock gating circuit, thereby suppressing a power consumption amount.

That is, according to the present invention, the power consumption amount can be suppressed by stopping supply of the clock during the whole period of the scan test. When the power cannot be suppressed in the scan shift period, malfunction can occur in the circuit, resulting in false determination of a tester. According to the present invention, since the power can be suppressed in the scan shift period, malfunction of the circuit can be prevented, thereby reducing false determination of the tester.

Although the embodiments of the present invention has been described in detail, a specific configuration is not limited to the above-mentioned embodiments, and may be modified so as not to deviate from the subject matter of the present invention. Such a modification is included in the present invention.

What is claimed is:

1. A semiconductor integrated circuit comprising:
    a plurality of scan flip-flops configured to form a scan chain in a scan test; and
    a plurality of clock gating circuits connected between a clock input and corresponding portions of said plurality of scan flip-flops, respectively, the clock input providing a clock signal,
    wherein said plurality of clock gating circuits are connected in series to form a chain and gating setting data is inputted serially through the chain connection,
    wherein each of said plurality of clock gating circuits controls a gating between the clock input and a corresponding portion of said plurality of scan flip-flops based on said gating setting data, and
    wherein one of said plurality of clock gating circuits gates clock pulses of the clock signal to said scan flip-flops corresponding to the one of said plurality of clock gating circuits and another one of said plurality of clock gating circuits excludes clock pulses to said scan flip-flops corresponding to said another one of said plurality of clock gating circuits, in response to said gating setting data.

2. The semiconductor integrated circuit according to claim 1, wherein each of said plurality of clock gating circuits comprises:
    a latch circuit;
    a first multiplexer; and
    a logical operation circuit,
    wherein said multiplexer selects and outputs one of said gating setting data and a clock gating enable output as an output of said latch circuit to said latch circuit, and
    wherein said logical operation circuit comprises a logical operation device configured to output a gated clock signal to the corresponding portion of said plurality of scan flip-flops based on said clock gating enable output and said clock input.

3. The semiconductor integrated circuit according to claim 2, wherein each of said plurality of scan flip-flops is switched between a scan shift mode and a capture mode based on a scan mode control signal, and
    said scan flip-flop comprises a second multiplexer configured to select in the scan shift mode, one of a first test pattern data supplied from a previous stage scan flip-flop of said plurality of scan flip-flops previous to said scan flip-flop and a second test pattern data taken into said scan flip-flop in response to said gated clock signal, based on a signal level of said clock gating enable signal, and outputs the selected data to a data output and a next stage scan flip-flop of said plurality of scan flip-flops.

4. The semiconductor integrated circuit according to claim 3, wherein said second multiplexer selects and outputs the second test pattern data to said data output in response to said gated clock signal in the capture mode.

5. A test method of a semiconductor integrated circuit, the test method comprising:
    setting a gating of a clock input providing a clock signal, by a plurality of clock gating circuits, for each portion of a plurality of scan flip-flops in a scan chain for a scan test, the plurality of clock gating circuits being connected between the clock input and corresponding portions of the plurality of scan flip-flops, respectively, the clock input providing a clock signal, said plurality of clock gating circuits being connected in series to form a chain; and
    inputting a test pattern data to said scan chain to which the gating is set to serially input gating setting data through the serial connection of the scan chain; and
    controlling, by the plurality of clock gating circuits, a gating between the clock input and a corresponding portion of said plurality of scan flip-flops based on said gating setting data,
    wherein one of the plurality of clock gating circuits gates clock pulses of the clock signal to said scan flip-flops corresponding to the one of said plurality of clock gating circuits and another one of said plurality of clock gating circuits excludes clock pulses to said scan flip-flops corresponding to said another one of said plurality of clock gating circuits, in response to said gating setting data.

6. The test method according to claim 5, wherein said setting comprises:
    serially inputting and holding the gating setting data to the plurality of clock gating circuits which are chain-connected in series; and
    controlling the gating of the clock input and each portion of said plurality of scan flip-flops based on said gating setting data held by a corresponding one of said plurality of clock gating circuits.

7. The test method according to claim 6, wherein said serially inputting of the test pattern data into said scan chain comprises:
    gating said clock input from a gating scan flip-flop of said plurality of scan flip-flops based on the setting of the gating; and
    passing the test pattern data through the first scan flip-flop to a next stage scan flip-flop.

* * * * *